(12) United States Patent
Jayasinghe et al.

(10) Patent No.: US 11,196,445 B2
(45) Date of Patent: Dec. 7, 2021

(54) DISTRIBUTED CRC POLAR CODES

(71) Applicants: Nokia Technologies Oy, Espoo (FI); Alcatel Lucent, Nozay (FR)

(72) Inventors: Keeth Saliya Jayasinghe, Piliyandala (LK); Yu Chen, Shanghai (CN); Dongyang Du, Zhejiang (CN); Jie Chen, Schaumburg, IL (US)

(73) Assignees: Nokia Technologies Oy, Espoo (FI); Alcatel Lucent, Nozay (FR)

( * ) Notice: Subject to any disclaimer, the term of this patent is extended or adjusted under 35 U.S.C. 154(b) by 92 days.

(21) Appl. No.: 16/610,620

(22) PCT Filed: May 4, 2017

(86) PCT No.: PCT/CN2017/083099
§ 371 (c)(1),
(2) Date: Nov. 4, 2019

(87) PCT Pub. No.: WO2018/201408
PCT Pub. Date: Nov. 8, 2018

(65) Prior Publication Data
US 2020/0067525 A1      Feb. 27, 2020

(51) Int. Cl.
*H03M 13/00*        (2006.01)
*H03M 13/09*        (2006.01)
(Continued)

(52) U.S. Cl.
CPC ......... *H03M 13/093* (2013.01); *H03M 13/27* (2013.01); *H04L 1/0061* (2013.01)

(58) Field of Classification Search
CPC .... H03M 13/093; H03M 13/27; H03M 13/09; H03M 13/091; H03M 13/15;
(Continued)

(56) References Cited

U.S. PATENT DOCUMENTS 9,178,532 B2      11/2015   Li et al. .................... 714/752
10,320,422 B2 *    6/2019   Shen ................. H04L 1/0061
(Continued)

FOREIGN PATENT DOCUMENTS

CN           101594205 A           12/2009

OTHER PUBLICATIONS

3GPP TSG-RAN WG1 Meeting #88, Athens, Greece, Feb. 13-17, 2017, R1-1703497, "Details of CRC Distribution of Polar Design", Nokia, Alcatel-Lucent Shanghai Bell, 9 pgs.
(Continued)

*Primary Examiner* — Christine T. Tu
(74) *Attorney, Agent, or Firm* — Harrington & Smith

(57) ABSTRACT

A method including determining a cyclic redundancy check (CRC) generator sequence defining a one to one mapping between a sequence of control information values and cyclic redundancy check (CRC) sequence values; and determining a combined sequence, the combined sequence formed by distributing the cyclic redundancy check (CRC) value sequence within the sequence of control information values, wherein the distributing the cyclic redundancy check (CRC) value sequence within the sequence of control information values is based on a selected part of the cyclic redundancy check (CRC) generator sequence.

22 Claims, 8 Drawing Sheets

(51) Int. Cl.
*H03M 13/27* (2006.01)
*H04L 1/00* (2006.01)

(58) Field of Classification Search
CPC ... H04L 1/0061; H04L 1/0071; H04L 1/0072; H04L 1/0073
USPC ....... 714/807, 758, 774, 755, 753, 751, 746, 714/799, 808, 810
See application file for complete search history.

(56) References Cited

U.S. PATENT DOCUMENTS

| | | | | |
|---|---|---|---|---|
| 2012/0066572 | A1* | 3/2012 | Lim | H04L 5/0053 714/807 |
| 2013/0132796 | A1* | 5/2013 | Vummintala | H03M 13/29 714/758 |
| 2014/0173376 | A1 | 6/2014 | Jeong et al. | 714/755 |
| 2014/0376461 | A1 | 12/2014 | Park et al. | |
| 2020/0099399 | A1* | 3/2020 | Xie | H03M 13/13 |

OTHER PUBLICATIONS

3GPP TSG-RAN WG1 #88bis Meeting, Spokane, USA, Apr. 3-7, 2017, R1-1705861, "Design Details of Distributed CRC", Nokia, Alcatel-Lucent Shanghai Bell, 6 pgs.
Ericsson; "Design of CRC-assisted Polar Code"; R1-1701630; 3GPP TSG-RAN WG1 #88; Athens, Greece; Feb. 13-17, 2017; whole document (7 pages).
Nokia et al.; "Polar codes design for UL control"; R1-1701033; 3GPP TSG-RAN WG1#NR Ad-Hoc meeting; Spokane, US; Jan. 16-20, 2017; whole document (5 pages).
NTT Docomo; "CRC related design of Polar codes"; R1-1705756; 3GPP TSG RAN WG1 Meeting #88bis; Spokane, USA; Apr. 3-7, 2017; whole document (6 pages).

* cited by examiner

_US 11,196,445 B2_

DISTRIBUTED CRC POLAR CODES

CROSS REFERENCE TO RELATED APPLICATION

This patent application is a U.S. National Stage application of International Patent Application Number PCT/CN2017/083099 filed May 4, 2017, which is hereby incorporated by reference in its entirety.

Polar codes, have been chosen to be used for 5G eMBB (enhanced Mobile Broadband) control channels and maybe also for mMTC (massive Machine Type Communications) because it has advantages compared to the other candidate coding schemes. For example it promises low complexity while achieving close to capacity levels of performance.

A CRC construction mechanism has been proposed with J CRC bits provided which may be used for error detection and may also be used to assist decoding and potentially for early termination. J may be different in Downlink (DL) and Uplink (UL) communication paths. Furthermore J may depend on the payload size in the UL (0 not precluded). Furthermore it has been proposed that in addition there may be employed J' bits for the purpose of assisting the polar decoding, where $0<=J'<=Jmax$, aiming for Jmax, e.g. in the region of 8 (other values are not precluded). This mechanism does not preclude the use of the J bits for assisting decoding and any Polar Coding frozen bits are considered to be among the J' bits.

The following are examples:

J bits CRC+J' bits CRC+basic polar;
J bits CRC+J' bits distributed CRC+basic polar;
(J+J') bits CRC+basic polar.

In the proposals mentioned above there are J CRC bits for error detection and J' (additional) bits which may be CRC, Parity, or Hash bits used for error correction purposes.

The J' error correcting bits can be placed in the non-frozen or frozen bit positions such a way that tree pruning happens whenever an info bit and associated CRC/parity/or Hash bit is available. In R1-1703497 "Details of CRC distribution of Polar design", Nokia, Alcatel-Lucent Shanghai Bell in in 3GPP TSG RAN WG1 Meeting #88, Athens, Greece, February 2017, a distributed method is proposed for tree pruning by distributing info and CRC bits such a way that it allows CRC checks to occur much earlier than usually happens. This allows early termination of the decoding.

In general, early termination is useful as it reduces the energy consumption of blind decodes and reduces the latency of recovery.

It has previously been proposed that a CRC generator matrix may be determined wherein by row and column swapping an upper triangle like matrix may be obtained. However such an approach required the application of Gaussian elimination methods to transform the CRC generator matrix to an upper triangle like matrix. As the generator matrix depends on the information block size, the receiver and transmitter has to perform these operations each time for each information block resulting in a computing complexity overhead which may be more than insignificant. There is the need in some circumstances to generate the CRC matrix in a simpler manner but maintain a similar level of performance with respect to CRC distribution.

There is hereby provided a method comprising: determining a cyclic redundancy check (CRC) generator sequence defining a one to one mapping between a sequence of control information values and cyclic redundancy check (CRC) sequence values; determining a combined sequence, the combined sequence formed by distributing the cyclic redundancy check (CRC) value sequence within the sequence of control information values, wherein the distributing the cyclic redundancy check (CRC) value sequence within the sequence of control information values is based on a selected part of the cyclic redundancy check (CRC) generator sequence.

Determining a cyclic redundancy check (CRC) generator sequence defining a one to one mapping between the control information values and cyclic redundancy check (CRC) sequence values may comprise determining a cyclic redundancy check (CRC) generator sequence of length based on a maximum control information block size to be encoded.

Determining a cyclic redundancy check (CRC) generator sequence of length based on a maximum control information block size to be encoded may comprise generating a unique interleaving/distribution pattern based on a maximum control information block size to be encoded, wherein the unique interleaving/distribution pattern comprises blanking indices configured to enable the determination of a distribution pattern for a smaller block size.

Determining a cyclic redundancy check (CRC) generator sequence of length based on a maximum control information block size to be encoded may comprise generating a unique interleaving/distribution pattern by selecting rows from a generator matrix in a bottom to top row order.

Determining a combined sequence may comprise selecting the part of the cyclic redundancy check (CRC) generator sequence based on a determined cyclic redundancy check transmission order.

Determining a combined sequence may further comprise generating a combined sequence part by: selecting control information values from the sequence of control information values based on the position of values within the selected part of the cyclic redundancy check (CRC) generator sequence; generating a cyclic redundancy check (CRC) value based on the selected control information values; and combining the selected control information values and the generated first cyclic redundancy check (CRC) value to generate the combined sequence part.

The method may further comprise amending elements of any further parts of the cyclic redundancy check (CRC) generator sequence to a zero value where associated elements of the selected part of the cyclic redundancy check (CRC) generator sequence have a one value.

Determining a combined sequence may further comprise generating further combined sequence parts by: selecting further parts of the cyclic redundancy check (CRC) generator sequence based on the CRC transmission order sequence; selecting control information values from the sequence of control information values based on the position of values within the selected further parts of the cyclic redundancy check (CRC) generator sequence; generating, for each of the further combined sequence parts, a cyclic redundancy check (CRC) value based on the control information values identified in the further parts of the cyclic; and combining, for each of the further combined sequence parts, the selected control information values and the generated cyclic redundancy check (CRC) value to generate the further combined sequence parts.

Determining a combined sequence may comprise determining only part of the combined sequence based on the selected part of the cyclic redundancy check (CRC) generator sequence.

Determining a cyclic redundancy check (CRC) generator sequence may comprise determining a cyclic redundancy check (CRC) generator matrix, and wherein the selected part of the cyclic redundancy check (CRC) generator sequence is a column of the a cyclic redundancy check (CRC) generator matrix selected based on the determined cyclic redundancy check transmission order.

The sequence of control information values may be control information bits and cyclic redundancy check (CRC) sequence values may be cyclic redundancy check (CRC) sequence bits.

The method may be for enabling early termination of polar encoded sequence of control information values, the method may further comprise polar encoding the combined sequence, wherein the distributing of the cyclic redundancy check (CRC) value sequence within the sequence of control information values may enable early termination of the polar encoded sequence.

The method may further comprise transmitting the polar encoding of the combined sequence.

According to a second aspect there is provided a method comprising: decoding the combined sequence, the combined sequence comprising a determined sequence of cyclic redundancy check (CRC) values within a sequence of control information values, to enable a first cyclic redundancy check (CRC) to be performed, the decoding generating a first cyclic redundancy check (CRC) value and associated control information values based on a part of a received cyclic redundancy check (CRC) generator sequence; performing a cyclic redundancy check (CRC) based on the first cyclic redundancy check (CRC) value and associated control information values; further decoding the combined sequence to enable further cyclic redundancy checks (CRC) to be performed; performing further cyclic redundancy checks based on the further decoding and based on a further part of the cyclic redundancy check (CRC) generator sequence at least one earlier decoded control information value.

Decoding the combined sequence may comprise editing a control information value sequence based on the decoded control information values and the part of a received cyclic redundancy check (CRC) generator sequence.

Further decoding the combined sequence to enable further cyclic redundancy checks (CRC) to be performed may comprise editing the control information value sequence based on the further decoded control information values and the further parts of the received cyclic redundancy check (CRC) generator sequence.

Generating a first cyclic redundancy check (CRC) value and associated control information values based on a part of a received cyclic redundancy check (CRC) generator sequence may comprise identifying a control information value location within the sequence of control information values based on the position of values within the selected part of the cyclic redundancy check (CRC) generator sequence.

The method may be for decoding a combined sequence of values comprising a determined sequence of cyclic redundancy check (CRC) values within a sequence of control information values such that the order of the values enables an early termination of decoding based on a cyclic redundancy check (CRC), the method may further comprise terminating decoding when failing the cyclic redundancy check or at least one of the further cyclic redundancy checks.

The method may further comprise receiving/determining a cyclic redundancy check (CRC) generator sequence defining a one to one mapping between the control information values and cyclic redundancy check (CRC) sequence values, the cyclic redundancy check (CRC) generator sequence may comprise a cyclic redundancy check (CRC) generator sequence of length based on a maximum control information block size to be encoded.

Receiving/determining a cyclic redundancy check (CRC) generator sequence may comprise receiving/determining a unique interleaving/distribution pattern based on a maximum control information block size to be encoded, wherein the unique interleaving/distribution pattern may comprise blanking indices configured to enable the determination of a distribution pattern for a smaller block size.

The cyclic redundancy check values may comprise one of: an error detection bit; an error correction bit.

According to a third aspect there is provided an apparatus comprising: a CRC sequence generator configured to determine a cyclic redundancy check (CRC) generator sequence defining a one to one mapping between a sequence of control information values and cyclic redundancy check (CRC) sequence values; a sequence determiner configured to determine a combined sequence, the combined sequence formed by distributing the cyclic redundancy check (CRC) value sequence within the sequence of control information values, wherein distributing the cyclic redundancy check (CRC) value sequence within the sequence of control information values is based on a selected part of the cyclic redundancy check (CRC) generator sequence.

The CRC sequence generator may be configured to determine a cyclic redundancy check (CRC) generator sequence of length based on a maximum control information block size to be encoded.

The CRC sequence generator may be configured to generate a unique interleaving/distribution pattern based on a maximum control information block size to be encoded, wherein the unique interleaving/distribution pattern comprises blanking indices configured to enable the determination of a distribution pattern for a smaller block size.

The sequence determiner may be configured to select the part of the cyclic redundancy check (CRC) generator sequence based on a determined cyclic redundancy check transmission order.

The sequence determiner may further be configured to generate a combined sequence part by being configured to: select control information values from the sequence of control information values based on the position of values within the selected part of the cyclic redundancy check (CRC) generator sequence; generate a cyclic redundancy check (CRC) value based on the selected control information values; and combine the selected control information values and the generated first cyclic redundancy check (CRC) value to generate the combined sequence part.

The sequence determiner may be configured to generate a unique interleaving/distribution pattern by selecting rows from a generator matrix in a bottom to top row order.

The CRC sequence generator may be further configured to amend elements of any further parts of the cyclic redundancy check (CRC) generator sequence to a zero value where associated elements of the selected part of the cyclic redundancy check (CRC) generator sequence have a one value.

The sequence determiner may be further configured to generate further combined sequence parts by being configured to: select further parts of the cyclic redundancy check (CRC) generator sequence based on the CRC transmission order sequence; select control information values from the sequence of control information values based on the position of values within the selected further parts of the cyclic redundancy check (CRC) generator sequence; generate, for each of the further combined sequence parts, a cyclic redundancy check (CRC) value based on the control information values identified in the further parts of the cyclic; and combine, for each of the further combined sequence parts, the selected control information values and the generated cyclic redundancy check (CRC) value to generate the further combined sequence parts.

The sequence determiner may be configured to determine only part of the combined sequence based on the selected part of the cyclic redundancy check (CRC) generator sequence.

The cyclic redundancy check (CRC) generator sequence may comprise determining a cyclic redundancy check (CRC) generator matrix, and wherein the selected part of the cyclic redundancy check (CRC) generator sequence may be a column of the a cyclic redundancy check (CRC) generator matrix selected based on the determined cyclic redundancy check transmission order.

The sequence of control information values may be control information bits and the cyclic redundancy check (CRC) sequence values may be cyclic redundancy check (CRC) sequence bits.

The apparatus may be configured to enable early termination of polar encoded sequence of control information values, the apparatus comprising a polar encoder configured to polar encode the combined sequence, wherein the distribution of the cyclic redundancy check (CRC) value sequence within the sequence of control information values enables early termination of the polar encoded sequence.

The apparatus may further comprise a transmitter configured to transmit the polar encoded combined sequence.

According to a fourth aspect there is provided an apparatus comprising: a decoder configured to decode a first part of an encoded combined sequence, the combined sequence comprising a determined sequence of cyclic redundancy check (CRC) values within a sequence of control information values, to enable a first cyclic redundancy check (CRC) to be performed, the decoder configured to generate a first cyclic redundancy check (CRC) value and associated control information values based on a part of a received cyclic redundancy check (CRC) generator sequence; a cyclic redundancy checker configured to perform a cyclic redundancy check (CRC) based on the first cyclic redundancy check (CRC) value and associated control information values; wherein the decoder is configured to further decode the combined sequence to enable further cyclic redundancy checks (CRC) to be performed, and the cyclic redundancy checker is further configured to perform further cyclic redundancy checks based on the further decoding and based on a further part of the cyclic redundancy check (CRC) generator sequence at least one earlier decoded control information value.

The decoder may be configured to edit a control information value sequence based on the decoded control information values and the part of a received cyclic redundancy check (CRC) generator sequence.

The decoder may be configured to edit the control information value sequence based on the further decoded control information values and the further parts of the received cyclic redundancy check (CRC) generator sequence.

The decoder may be configured to generate a first cyclic redundancy check (CRC) value and associated control information values based on a part of a received cyclic redundancy check (CRC) generator sequence comprising identifying a control information value location within the sequence of control information values based on the position of values within the selected part of the cyclic redundancy check (CRC) generator sequence.

The decoder may be configured to decode the combined sequence of values comprising a determined sequence of cyclic redundancy check (CRC) values within a sequence of control information values such that the order of the values enables an early termination of decoding based on a cyclic redundancy check (CRC).

The cyclic redundancy checker may be configured to terminate the operation of the decoder when failing the cyclic redundancy check or at least one of the further cyclic redundancy checks.

The decoder may be configured to receive/determine a cyclic redundancy check (CRC) generator sequence defining a one to one mapping between the control information values and cyclic redundancy check (CRC) sequence values, the cyclic redundancy check (CRC) generator sequence comprising a cyclic redundancy check (CRC) generator sequence of length based on a maximum control information block size to be encoded.

The decoder configured to receive/determine a cyclic redundancy check (CRC) generator sequence may be configured to receive/determine a unique interleaving/distribution pattern based on a maximum control information block size to be encoded, wherein the unique interleaving/distribution pattern comprises blanking indices configured to enable the determination of a distribution pattern for a smaller block size.

The cyclic redundancy check values may comprise one of: an error detection bit; an error correction bit.

According to a fifth aspect there is provided an apparatus comprising: means for determining a cyclic redundancy check (CRC) generator sequence defining a one to one mapping between a sequence of control information values and cyclic redundancy check (CRC) sequence values; means for determining a combined sequence, the combined sequence formed by distributing the cyclic redundancy check (CRC) value sequence within the sequence of control information values, wherein the distributing the cyclic redundancy check (CRC) value sequence within the sequence of control information values is based on a selected part of the cyclic redundancy check (CRC) generator sequence.

The means for determining a cyclic redundancy check (CRC) generator sequence defining a one to one mapping between the control information values and cyclic redundancy check (CRC) sequence values may comprise means for determining a cyclic redundancy check (CRC) generator sequence of length based on a maximum control information block size to be encoded.

The means for determining a cyclic redundancy check (CRC) generator sequence of length based on a maximum control information block size to be encoded may comprise means for generating a unique interleaving/distribution pattern based on a maximum control information block size to be encoded, wherein the unique interleaving/distribution pattern comprises blanking indices configured to enable the determination of a distribution pattern for a smaller block size.

The means for determining a cyclic redundancy check (CRC) generator sequence of length based on a maximum control information block size to be encoded may comprise means for generating a unique interleaving/distribution pattern by selecting rows from a generator matrix in a bottom to top row order.

The means for determining a combined sequence may comprise means for selecting the part of the cyclic redundancy check (CRC) generator sequence based on a determined cyclic redundancy check transmission order.

The means for determining a combined sequence may further comprise means for generating a combined sequence part by: selecting control information values from the sequence of control information values based on the position of values within the selected part of the cyclic redundancy check (CRC) generator sequence; means for generating a cyclic redundancy check (CRC) value based on the selected control information values; and means for combining the selected control information values and the generated first cyclic redundancy check (CRC) value to generate the combined sequence part.

The apparatus may further comprise means for amending elements of any further parts of the cyclic redundancy check (CRC) generator sequence to a zero value where associated elements of the selected part of the cyclic redundancy check (CRC) generator sequence have a one value.

The means for determining a combined sequence may further comprise means for generating further combined sequence parts by: selecting further parts of the cyclic redundancy check (CRC) generator sequence based on the CRC transmission order sequence; means for selecting control information values from the sequence of control information values based on the position of values within the selected further parts of the cyclic redundancy check (CRC) generator sequence; generating, for each of the further combined sequence parts, a cyclic redundancy check (CRC) value based on the control information values identified in the further parts of the cyclic; and means for combining, for each of the further combined sequence parts, the selected control information values and the generated cyclic redundancy check (CRC) value to generate the further combined sequence parts.

The means for determining a combined sequence may comprise means for determining only part of the combined sequence based on the selected part of the cyclic redundancy check (CRC) generator sequence.

The means for determining a cyclic redundancy check (CRC) generator sequence may comprise means for determining a cyclic redundancy check (CRC) generator matrix, and wherein the selected part of the cyclic redundancy check (CRC) generator sequence is a column of the a cyclic redundancy check (CRC) generator matrix selected based on the determined cyclic redundancy check transmission order.

The sequence of control information values may be control information bits and cyclic redundancy check (CRC) sequence values may be cyclic redundancy check (CRC) sequence bits.

The apparatus may be for enabling early termination of polar encoded sequence of control information values, the apparatus may further comprise means for polar encoding the combined sequence, wherein the means for distributing of the cyclic redundancy check (CRC) value sequence within the sequence of control information values may enable early termination of the polar encoded sequence.

The apparatus may further comprise means for transmitting the polar encoding of the combined sequence.

According to a sixth aspect there is provided an apparatus comprising: means for decoding the combined sequence, the combined sequence comprising a determined sequence of cyclic redundancy check (CRC) values within a sequence of control information values, to enable a first cyclic redundancy check (CRC) to be performed, the means for decoding generating a first cyclic redundancy check (CRC) value and associated control information values based on a part of a received cyclic redundancy check (CRC) generator sequence; means for performing a cyclic redundancy check (CRC) based on the first cyclic redundancy check (CRC) value and associated control information values; the means for decoding further decoding the combined sequence to enable further cyclic redundancy checks (CRC) to be performed; the means for performing a CRC performing further cyclic redundancy checks based on the further decoding and based on a further part of the cyclic redundancy check (CRC) generator sequence at least one earlier decoded control information value.

The means for decoding the combined sequence may comprise means for editing a control information value sequence based on the decoded control information values and the part of a received cyclic redundancy check (CRC) generator sequence.

Further means for decoding may comprise means for editing the control information value sequence based on the further decoded control information values and the further parts of the received cyclic redundancy check (CRC) generator sequence.

The means for generating a first cyclic redundancy check (CRC) value and associated control information values based on a part of a received cyclic redundancy check (CRC) generator sequence may comprise means for identifying a control information value location within the sequence of control information values based on the position of values within the selected part of the cyclic redundancy check (CRC) generator sequence.

The apparatus may be for decoding a combined sequence of values comprising a determined sequence of cyclic redundancy check (CRC) values within a sequence of control information values such that the order of the values enables an early termination of decoding based on a cyclic redundancy check (CRC), the apparatus may further comprise means for terminating decoding when failing the cyclic redundancy check or at least one of the further cyclic redundancy checks.

The apparatus may further comprise means for receiving/determining a cyclic redundancy check (CRC) generator sequence defining a one to one mapping between the control information values and cyclic redundancy check (CRC) sequence values, the cyclic redundancy check (CRC) generator sequence may comprise a cyclic redundancy check (CRC) generator sequence of length based on a maximum control information block size to be encoded.

The means for receiving/determining a cyclic redundancy check (CRC) generator sequence may comprise means for receiving/determining a unique interleaving/distribution pattern based on a maximum control information block size to be encoded, wherein the unique interleaving/distribution pattern may comprise blanking indices configured to enable the determination of a distribution pattern for a smaller block size.

The cyclic redundancy check values may comprise one of: an error detection bit; an error correction bit.

In some embodiments, the interleaving/deinterleaving pattern is constructed from the CRC generator matrix rows in the from bottom to top order. This is beneficial to reduce the complexity in implementation because the module using the pattern can easily skip the unrelated indices in the pattern.

There is also hereby provided a computer program product comprising program code means which when loaded into a computer controls the computer to perform the method described herein.

Examples of techniques according to embodiments of the invention are described hereunder in detail, by way of example only, with reference to the accompanying drawings, in which.

Techniques according to embodiments of the present invention are described in detail below, by way of example only.

The concepts as discussed in further detail propose new methods for enabling early termination utilizing CRC bits purposed for both error correction and detection.

In particular the concepts as discussed in further detail hereafter concern apparatus and methods for enabling early termination of polar encoded sequences of control information values. The embodiments enable this by determining a cyclic redundancy check (CRC) generator sequence defining a one to one mapping between a sequence of control information values and cyclic redundancy check (CRC) sequence values. Having determined this a combined sequence is determined, the combined sequence formed by distributing the cyclic redundancy check (CRC) value sequence within the sequence of control information values. The distributing of the cyclic redundancy check (CRC) value sequence within the sequence of control information values is furthermore based on a selected part of the cyclic redundancy check (CRC) generator sequence. This combined sequence may then be polar encoded, wherein the distributing of the cyclic redundancy check (CRC) value sequence within the sequence of control information values enables early termination of the polar encoded sequence.

Similarly the concept may be expressed with respect to an apparatus and method for decoding a combined sequence of values comprising a determined sequence of cyclic redundancy check (CRC) values within a sequence of control information values such that the order of the values enables an early termination of decoding based on a cyclic redundancy check (CRC). This apparatus and method for decoding may decode the combined sequence to enable a first cyclic redundancy check (CRC) to be performed. The decoding generates a first cyclic redundancy check (CRC) value and associated control information values as determined by a part of a received cyclic redundancy check (CRC) generator sequence. Then is may be possible to perform a cyclic redundancy check (CRC) based on the first cyclic redundancy check (CRC) value and associated control information values. The apparatus and method may then further decode the combined sequence to enable further cyclic redundancy checks (CRC) to be performed and perform further cyclic redundancy checks based on the further decoding and based on a further part of the cyclic redundancy check (CRC) generator sequence at least one earlier decoded control information value.

The distribution as disclosed herein can also in some embodiments be used with respect to parity or hash bits, where parity or hash bits are distributed such a way that they can decode together with the information bits and be used to enable the early termination.

Figure 1:
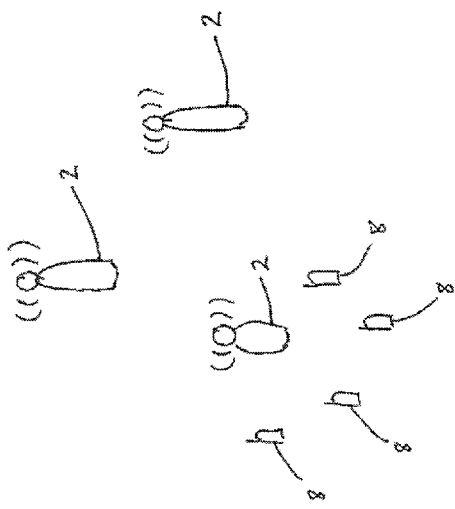
FIG. 1 illustrates one example of an environment in which embodiments of the present invention may be implemented.

FIG. 1 schematically shows an example of four user equipments (UEs) (for example, high complexity devices such as smartphones etc., low complexity devices such as Machine Type Communications (MTC) devices or any other type of wireless communication device) 8 located within the coverage area of a cell operated by a wireless network infrastructure node, which is generally referred to below as a base station (BS). FIG. 1 only shows a small number of base stations, but a radio access network typically comprises a large number of base stations each operating one or more cells.

Each BS 2 of a radio access network is typically connected to one or more core network entities and/or a mobile management entity etc., but these other entities are omitted from FIG. 1 for conciseness.

Figure 2:
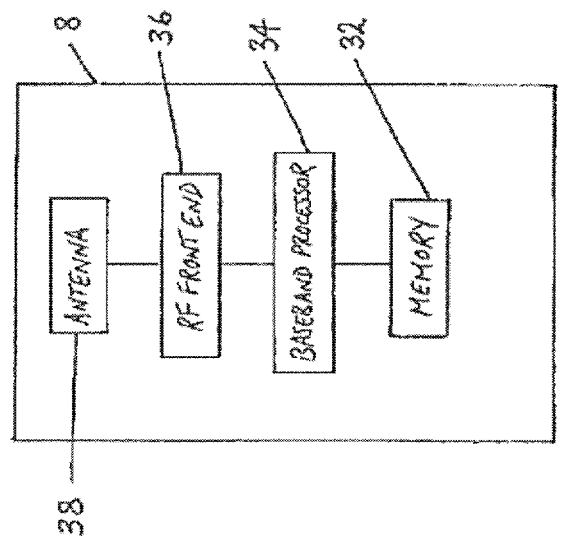
FIG. 2 illustrates one example of apparatus for use at the UEs of FIG. 1.

FIG. 2 shows a schematic view of an example of apparatus for each UE 8. The UE 8 may be used for various tasks such as making and receiving phone calls, receiving and sending data from and to a data network, and experiencing, for example, multimedia or other content. The UE 8 may be any device at least capable of both recovering data/information from radio transmissions made by the BS 2, and making radio transmissions from which data/information is recoverable by the BS 2. Non-limiting examples of user equipment (UE) 8 include smartphones, tablets, personal computers, and devices without any user interface, such as devices that are designed for machine type communications (MTC).

With reference to FIG. 2, a baseband processor 34, operating in accordance with program code stored at memory 32, controls the generation and transmission of radio signals via radio-frequency (RF) front end 36 and antenna 38. The RF front end 36 may include an analogue transceiver, filters, a duplexer, and antenna switch. Also, the combination of antenna 38, RF front end 36 and baseband processor 34 recovers data/information from radio signals reaching UE 8 from e.g. BS 2. The UE 8 may also comprise an application processor (not shown) that generates user data for transmission via radio signals, and processes user data recovered from radio signals by baseband processor 34 and stored at memory 32.

The application processor and the baseband processor 34 may be implemented as separate chips or combined into a single chip. The memory 32 may be implemented as one or more chips. The memory 32 may include both read-only memory and random-access memory. The above elements may be provided on one or more circuit boards.

The UE may include additional other elements not shown in FIG. 2. For example, the UE 8 may include a user interface such as a key pad, voice command recognition device, touch sensitive screen or pad, combinations thereof or the like, via which a user may control operation of the UE 8. The UE 8 may also include a display, a speaker and a microphone. Furthermore, the UE 8 may comprise appropriate connectors (either wired or wireless) to other devices and/or for connecting external accessories (e.g. hands-free equipment) thereto.

Figure 3:
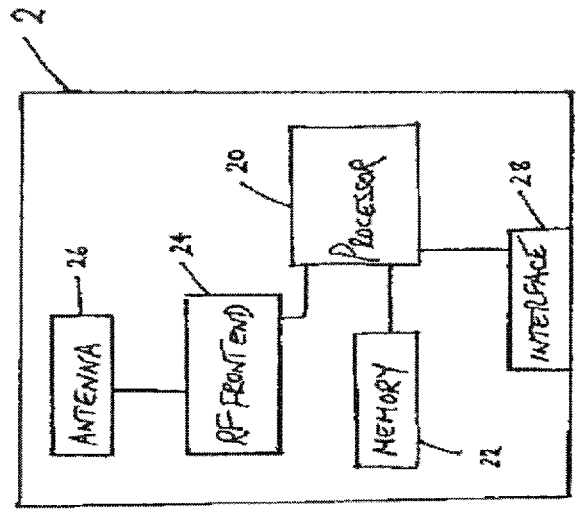
FIG. 3 illustrates one example of apparatus for use at the eNB of FIG. 1.

FIG. 3 shows an example of apparatus for use at the BS 2 of FIG. 1. A baseband processor 20, operating in accordance with program code stored at memory 22, (a) controls the generation and transmission of radio signals via the combination of RF front end 24 and antenna 26; and (b) recovers control information/data from radio transmissions reaching the BS from e.g. UEs 8. The RF front end may include an analogue transceiver, filters, a duplexer, and antenna switch. Both the processor 20 and the memory 22 may be implemented as one or more chips. The memory 22 may include both read-only memory and random-access memory. The above elements may be provided on one or more circuit boards. The apparatus also comprises an interface 28 for transferring data to and from one or more other entities such as e.g. core network entities, mobile management entities, and other base stations in the same access network.

It should be appreciated that the apparatus shown in each of FIGS. 2 and 3 described above may comprise further elements which are not directly involved with the embodiments of the invention described hereafter.

Figure 4:
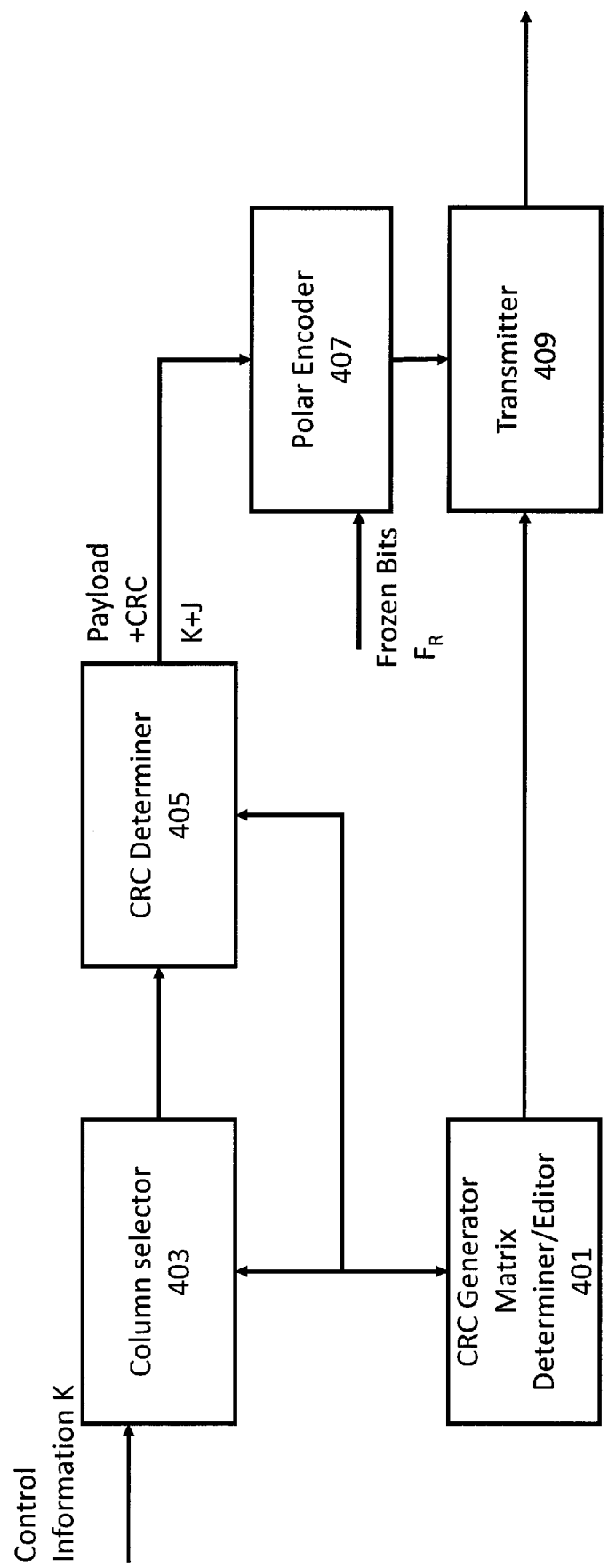
FIG. 4 illustrates an example encoder for use in the UEs and eNB of FIGS. 1 to 3 according to some embodiments.

With respect to FIG. 4 an example of an encoder employing CRC code generation according to some embodiments is shown.

In some embodiments the encoder comprises a CRC generator matrix determiner/editor 401. The CRC generator matrix determiner/editor 401 is configured to determine (either alone or in agreement with the decoder) a CRC generator matrix.

A CRC generator matrix (or more generally a CRC generator sequence) may be considered to comprise two parts, an identity part on the left and check part on the right, where $g_{i,j}$ is 0 or 1.

$$G = \begin{pmatrix} 1 & \cdots & 0 & g_{0,0} & \cdots & g_{0,k-1} \\ \vdots & \ddots & \vdots & \vdots & \ddots & \vdots \\ 1 & \cdots & 1 & g_{n-1,0} & \cdots & g_{n-1,k-1} \end{pmatrix}$$

The CRC generator matrix may be applied to the control information bits in order to determine a suitable block or matrix which may then be polar encoded according to any suitable polar encoding method.

Focusing on the check part of G, denoted as $\acute{G}$. It is known that by row and column swapping, an upper triangle like matrix can be obtained from matrix $\acute{G}$, denoted by $\hat{G}$. In $\hat{G}$, d(i) is maximum row index that has element 1 in column i. It is possible to have similar upper triangle like matrix by only row swapping, but with additional column swapping, the columns in the frontward could have fewer non-zero elements. Since only swapping is used, so the error detection property is not changed theoretically. Hence it does not change the block error rate (BLER) when these bits are only used for error detection.

$$\acute{G} = \begin{pmatrix} g_{0,0} & \cdots & g_{0,K-1} \\ \vdots & \ddots & \vdots \\ g_{n-1,0} & \cdots & g_{n-1,k-1} \end{pmatrix}$$

$$\hat{G} = \begin{pmatrix} g'_{0,0} & g'_{0,1} & & g'_{0,k-1} \\ g'_{1,0} & g'_{1,1} & & g'_{1,k-1} \\ \vdots & \vdots & \cdots & \vdots \\ g'_{d(0),0} & \vdots & & \vdots \\ 0 & g'_{d(1),1} & & \vdots \\ 0 & 0 & & \vdots \\ \vdots & & \ddots & \vdots \\ 0 & \vdots & 0 & \cdots & g'_{d(k-1),k-1} \end{pmatrix}$$

From the above matrix, G, $\acute{G}$ or $\hat{G}$, a specific CRC bit is only related to a subset of the information bits. Due to the successive decoding of polar code, if all the related information bits are decoded at some decoding stage, then the error check of the CRC bit can be implemented without necessarily decoding the whole block.

This opens the possibility to distribution of the CRC bits forward within the block sequence order to support early decoding termination. The row/column swapping method as discussed previously requires the use of gaussian elimination methods to shape the CRC generator matrix into an upper triangle like matrix. Furthermore as the CRC generator matrix depends on the control information block size, the decoder (receiver) and encoder (transmitter) has to perform these operations each time for each information block. As discussed this generates a large processing overhead.

There is one interesting property of CRC generator matrix. Suppose the generator matrix for information block size K, is $G_K=\{g_K, g_{K-1}, \ldots, g_1\}$, where $g_1, \ldots, g_K$ are the row vectors of $G_K$. For information block size K+1, the CRC generator matrix is $G_{K+1}$. It has the property of $G_{K+1}=\{g_{K+1}, g_K, g_{K-1}, \ldots, g_1\}=\{g_{K+1}, G_K\}$. In other words the CRC generator matrix of block size K is part of CRC generator matrix for K+1. The difference is one new row is added on top.

Figure 9:
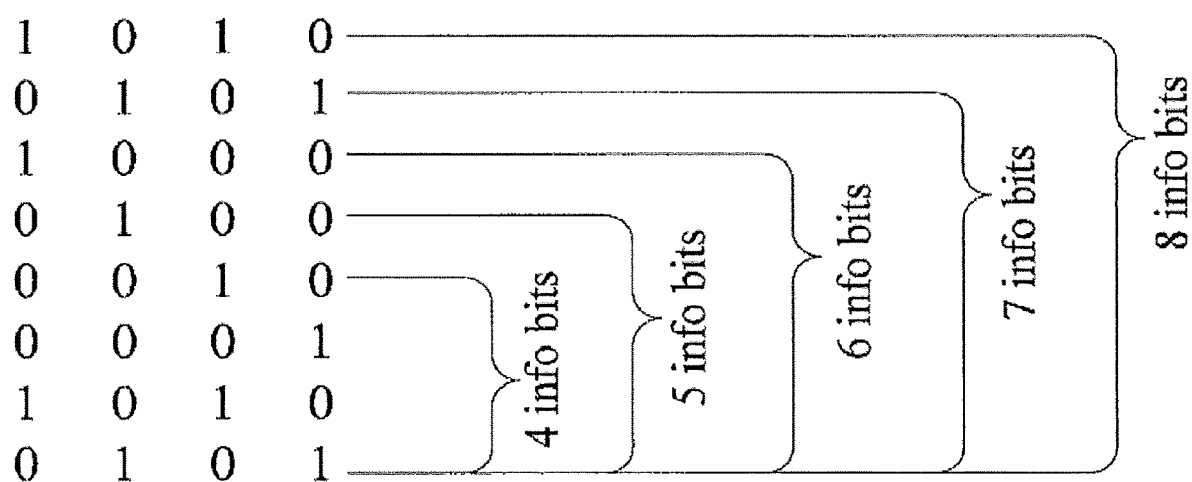
FIG. 9 is an example 4 bit CRC generator matrix for 8 information bits.

For example, shown in FIG. 9 is an example 4 bit CRC generator matrix for 8 information bits. It contains the CRC generator matrix for 4, 5, 6 and 7 information bits.

This means if the CRC generator matrix for the largest possible information block, on the hundred-level of information bits is stored, the CRC generator matrix for any arbitrary information block size can be easily generated from this as long as the block size is no bigger than the stored one. In such a manner it is not needed to store CRC generator matrix for each information block size. A stored/memory based method generating a CRC generator matrix is preferred because dynamic generation of the matrix by elementary transposing is quite complex.

Thus in some embodiments, the interleaving/deinterleaving pattern is constructed from the CRC generator matrix by selecting rows in the order from bottom to top. This is beneficial to reduce the complexity in implementation because the module using the pattern can easily skip the unrelated indices in the pattern.

The next property of a CRC generator matrix is that the columns of the CRC generator matrix can be grouped into one or a few parts (or sections), depending on the CRC polynomial. A part may comprise the columns correspond to 1 and the 0s followed by it in the CRC polynomial from left to right.

For example, the CRC polynomial for an example 16 bit CRC is shown below: [1 0 0 0 1 0 0 0 0 0 0 1 0 0 0 1]

This example polynomial may be divided into three parts corresponding to {1 0 0 0}, {1 0 0 0 0 0 0}, and {1 0 0 0 0}

This could be understood by the structure of the shift register based CRC generator, where one part comprises a shift register connecting an XOR operator and the following shift registers after it not connecting the XOR operator.

The column property is such that the columns in a part are shifted versions of each other. So, one column can be used to generate other columns in the CRC generator matrix of the same part. This is useful to further reduce the memory required to store the generator matrix.

For a suitable CRC distribution scheme, approximately only 6 bits can be moved forward in a 16 bit CRC scheme due to a CRC generation restriction. As the performance of early decoder termination between first 4 CRC bits is similar to the 6 bit case the encoder as described hereafter only needs to consider one or a limited number of parts of the CRC generator matrix. Hence, it is possible that only one column in a part is stored for the largest possible information block, and hence the whole section for arbitrary size of information block can be generated from this.

The concept once the CRC generator matrix is determined is to assign one or multiple CRC parts (or sections) based on which early termination is used. The encoder (transmitter) and/or the decoder (receiver) may then be configured to locally generate a sequence of the length N+M, where N is the maximum information block size to be supported by this method. M is a margin because the columns are shifted with each other so an additional margin is needed. The part may be a column of the CRC generator matrix.

In some embodiments the CRC generator matrix determiner/editor 401 may be configured to define the transmission order of the CRC bits in the part, the order is denoted by $\{C_1, C_2, \ldots, C_n\}$, where there are n CRC bits in the part. In some embodiments the CRC generator matrix determiner/editor 401 may also define the transmission order of the information bits and the corresponding CRC bits. For example, whether the CRC bit is to be transmitted after all of its corresponding information bits.

As the CRC generator matrix sections may be considered to have columns which are shifted versions of each other, in some embodiments the CRC generator matrix determiner/editor 401 can exploit this property when determining the generator matrix and store the columns of the generator matrix that can generate as many as possible of other columns to save memory and transmission bandwidth.

Furthermore in some embodiments CRC generator matrix determiner/editor 401 can be configured to determine which columns of the generator matrix are selectable columns by based on a pre-selection (or choosing) operation. For example the CRC generator matrix determiner/editor 401 may be configured to choose the columns with a minimum differential weight. This choice of selectable columns can be implemented by performing:

1. Selecting the column with minimum column weight. The column weight is defined as number of 1s in that column. For a CRC generator matrix, different columns may not have the same weight.

2. Selecting the column with minimum sum value of the rows equal to 1 but equal to 0 in the previously selected columns.

Thus for example set of row indices of the elements of the column i that have 1 bit value is denoted by Bi. The column index selected in step j is denoted by s(j). Where the step 1 is to select a column with minimum column weight.

The column to be selected in the later jth step satisfies $$\text{Arg} \min_{k \in S - s(1) - s(2) - \ldots - s(j-1)} W(B_k - (B_{s(1)} \cup B_{s(2)} \cup \ldots B_{s(j-1)}))$$

Where the function W( ) is used to calculate the number of 1 bit value for the given row indices of a specific column. Operator "−" is the operation to calculate the complementary set. B-A includes all the elements in B but not in A. The total column indices compose a set which is denoted by S.

3. Repeating 1 and 2 until the desired number of columns are selected.

In some embodiments the CRC generator matrix determiner/editor 401 is configured to perform a hybrid pre-selection where it chooses the column with the minimum column weight and then chooses the columns of the same section or the column that can be easily generated by the selected columns.

In some embodiments the CRC generator matrix determiner/editor 401 may pre-select the columns by defining a large pattern directly (for example the complete generator matrix) and the patterns for smaller number of block sizes are derived from it. By specifying the pattern, the parameters such as the CRC bit sequence used for distribution are also given implicitly.

In some embodiments this information may be passed to the transmitter 409 to output to the decoder.

In some embodiments the encoder comprises a column selector 403. The column selector 403 may be configured to select a part of the generator sequence, in other words a column of the generator matrix, based on the determined transmission order.

Furthermore in some embodiments the column selector 403 may be configured to receive the information bits (the control information or control payload) K bits. The column selector 403 may be configured to check the selected column values one by one sequentially. Where the column value is a 1 then the information bit is passed to the CRC determiner 405 where in some embodiments it is stored as part of an information bit in a bit array. In some embodiments this may be achieved by loading the selected column values into a shift register and performing a repeated (left) shift operation on the column array values. The selected information bits are located in the information bit array as identified by the shift loop index value when the most significant bit has a 1 value.

Additionally in some embodiments where a column value is a 1 then the CRC generator matrix determiner/editor 401 and the CRC generator matrix determiner/editor 401 is configured to edit the CRC generator matrix such that it is configured to set associated elements of any unprocessed columns with the same indices to be zero.

This sequential selection may be performed, where the next column associated with the next CRC bit to be transmitted is selected until a determined number of columns are processed in such a manner. This determined number may be any suitable number.

In some embodiments the encoder comprises a CRC determiner 405. The CRC determiner is configured to receive the selected information bits (which may be stored as an information bit array of selected and previously selected information bits). The CRC determiner 405 may then be configured to generate the CRC bit associated with the column. If after the determined number of selected columns have been processed there are remaining information bits and/or CRC bits to be determined then these are then selected and/or determined.

The determined CRC bits and new information bits may then be output to the polar encoder 407.

In some embodiments the encoder comprises a polar encoder 407. The polar encoder 407 may be configured to receive the information bits and CRC bits in a suitable ordered combination provided by the CRC determiner and then process these with suitable frozen bits before passing them to a transmitter 409.

In some embodiments the encoder comprises a transmitter 409. The transmitter is configured to receive the polar encoded combined sequence and output this to the decoder. The transmitter 409 in some embodiments is an output configured to store the sequence on some memory or storage device for later retrieval by the decoder.

Figure 5:
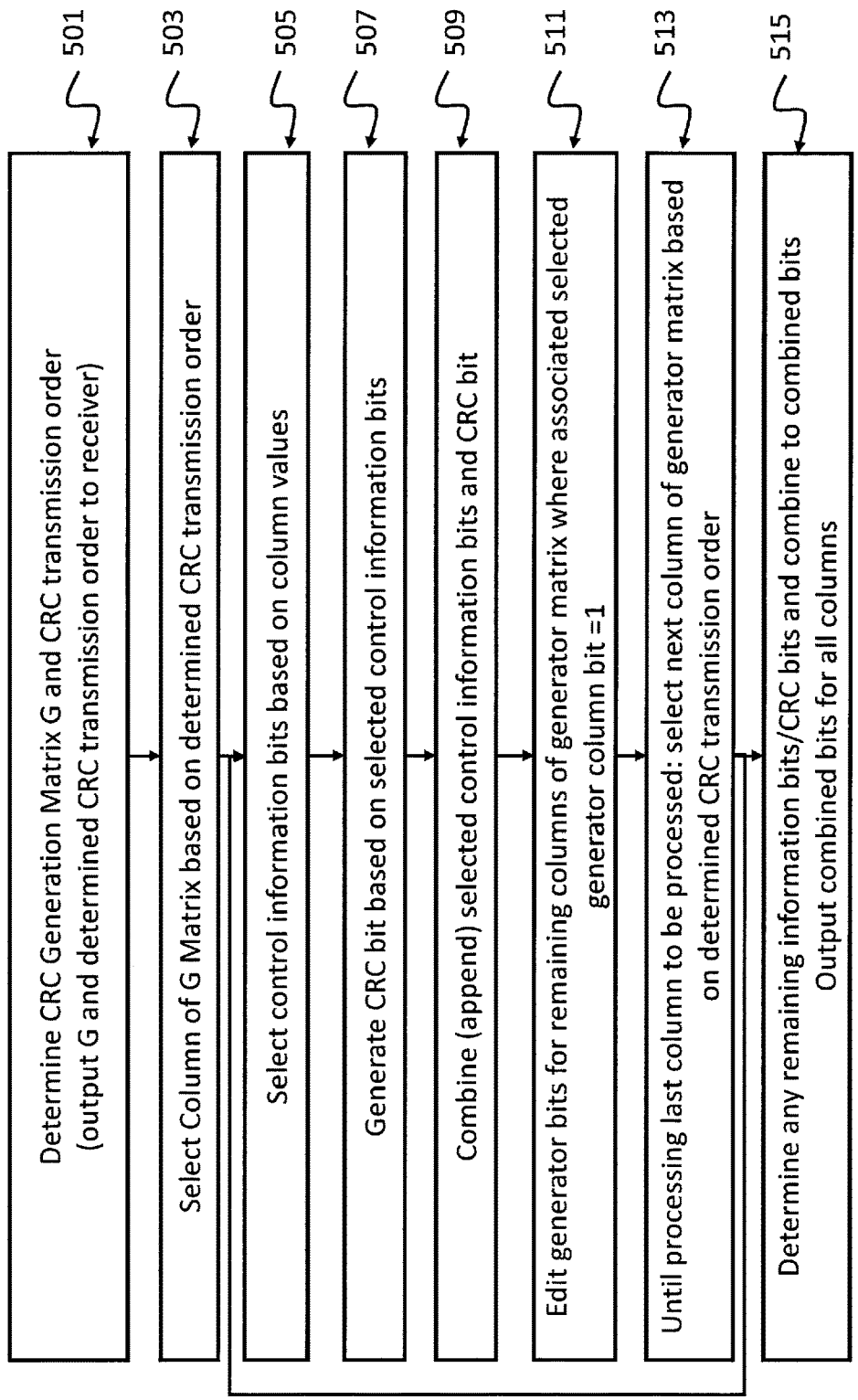
FIG. 5 is a flow diagram of the operation of the encoder as shown in FIG. 4 according to some embodiments.

With respect to FIG. 5 an example operation of the encoder is described.

In some embodiments the first operation is one of determining the CRC Generation Matrix G and CRC transmission order. This as described above may achieved by any suitable method such as retrieving a sub-matrix from a previously stored generation matrix or determining the matrix from a repeating part (or seed) applied to a logic function polynomial. In some embodiments furthermore this matrix (or seed) and the determined CRC transmission order to a decoder or receive.

The operation of determining a CRC generation matrix and CRC transmission order is shown in FIG. 5 by step 501.

For example this may be represented by the example wherein the maximum number of information bits to be transmitted is 20, i.e. N=20. The number of CRC bits are 16, and the first 4 CRC bits are used for distribution, so the margin M is 4. The N+M=24 CRC generator matrix may be generated as follows:

| Col. number | 1 | 2 | 3 | 4 | 5 | 6 | 7 | 8 | 9 | 10 | 11 | 12 | 13 | 14 | 15 | 16 |
|---|---|---|---|---|---|---|---|---|---|---|---|---|---|---|---|---|
| | 1 | 0 | 1 | 0 | 1 | 0 | 0 | 1 | 1 | 0 | 1 | 0 | 0 | 0 | 0 | 1 |
| | 1 | 1 | 0 | 1 | 1 | 1 | 1 | 0 | 0 | 1 | 1 | 0 | 0 | 0 | 0 | 0 |
| | 0 | 1 | 1 | 0 | 1 | 1 | 1 | 0 | 0 | 1 | 1 | 0 | 0 | 0 | 0 | 0 |
| | 0 | 0 | 1 | 1 | 0 | 1 | 1 | 1 | 0 | 0 | 1 | 1 | 0 | 0 | 0 | 0 |
| | 0 | 0 | 0 | 1 | 1 | 0 | 1 | 1 | 1 | 0 | 0 | 1 | 1 | 0 | 0 | 0 |
| | 0 | 0 | 0 | 0 | 1 | 1 | 0 | 1 | 1 | 1 | 0 | 0 | 1 | 1 | 0 | 0 |
| | 0 | 0 | 0 | 0 | 0 | 1 | 1 | 0 | 1 | 1 | 1 | 0 | 0 | 1 | 1 | 0 |
| | 0 | 0 | 0 | 0 | 0 | 0 | 1 | 1 | 0 | 1 | 1 | 1 | 0 | 0 | 1 | 1 |
| | 1 | 0 | 0 | 0 | 1 | 0 | 0 | 1 | 1 | 0 | 1 | 0 | 1 | 0 | 0 | 1 |
| | 1 | 1 | 0 | 0 | 1 | 1 | 0 | 0 | 1 | 1 | 0 | 0 | 0 | 1 | 0 | 0 |
| | 0 | 1 | 1 | 0 | 0 | 1 | 1 | 0 | 0 | 1 | 1 | 0 | 0 | 0 | 1 | 0 |
| | 0 | 0 | 1 | 1 | 0 | 0 | 1 | 1 | 0 | 0 | 1 | 1 | 0 | 0 | 0 | 1 |
| | 1 | 0 | 0 | 1 | 0 | 0 | 0 | 1 | 1 | 0 | 0 | 0 | 1 | 0 | 0 | 0 |
| | 0 | 1 | 0 | 0 | 1 | 0 | 0 | 0 | 1 | 1 | 0 | 0 | 0 | 1 | 0 | 0 |
| | 0 | 0 | 1 | 0 | 0 | 1 | 0 | 0 | 0 | 1 | 1 | 0 | 0 | 0 | 1 | 0 |
| | 0 | 0 | 0 | 1 | 0 | 0 | 1 | 0 | 0 | 0 | 1 | 1 | 0 | 0 | 0 | 1 |
| | 1 | 0 | 0 | 0 | 0 | 0 | 0 | 1 | 0 | 0 | 0 | 0 | 1 | 0 | 0 | 0 |
| | 0 | 1 | 0 | 0 | 0 | 0 | 0 | 0 | 1 | 0 | 0 | 0 | 0 | 1 | 0 | 0 |
| | 0 | 0 | 1 | 0 | 0 | 0 | 0 | 0 | 0 | 1 | 0 | 0 | 0 | 0 | 1 | 0 |
| | 0 | 0 | 0 | 1 | 0 | 0 | 0 | 0 | 0 | 0 | 1 | 0 | 0 | 0 | 0 | 1 |

If the required transmission order of the CRC bits corresponds to [4, 3, 2, 1]. In other words the order of CRC bit transmission which is to be used for early termination of the decoding process is $4^{th}$ CRC, $3^{rd}$ CRC, $2^{nd}$ CRC and then $1^{st}$ CRC bit.

The next step is to select one of the columns based on the order of the CRC bit transmission.

The operation of selecting a column of the generator matrix based on determined CRC transmission order is shown in FIG. 5 by step 503.

In the example above as the first CRC bit to be transmitted is the $4^{th}$ CRC the $4^{th}$ column is selected. In other words for the example generator matrix the stored or selected part of the sequence is the fourth column. In some embodiments the selected part is rewritten from the bottom to the top of the column to a left to right and the last four bits are used for generating other columns not for transmission. In other words the first column selection may be rewritten (without the last four bits) as:

[1  0  0  0  1  0  0  1  1  0  0  0 0 0 0 1]  (1)

In some embodiments the other early termination columns may be (pre)generated or read from the generator matrix before selection. In this example the other columns may be represented by the $3^{rd}$, $2^{nd}$ and $1^{st}$ columns and which may respectively be:

[0  1  0  0  0  1  0  0  1  1  0  0 0 0 0]  (2)
[0  0  1  0  0  0  1  0  0  1  1  0 0 0 0]  (3)
[0  0  0  1  0  0  0  1  0  0  1  1 0 0 0 0]  (4)

In some embodiments the following operation is to use the selected part or column to then select the information bits based on the column.

The operation of selecting control information bits based on the selected column values is shown in FIG. 5 by step 505.

In this example there are 16 information bits to be transmitted which may be defined as the array.

[b0, b1, b2, b3, b4, b5, b6, b7, b8, b9, b10, b11, b12, b13, b14, b15]

Thus for the first column selection, column (1), from left to right where the generator column is a 1 the information bit is selected. Thus by loading the example selected column values into a shift register and performing a repeated shift operation on the column array values. The selected information bits location in the information bit array is based on the shift loop index value when the most significant bit has a 1 value.

This results in a selected information bit sequence of:

[b0, b4, b7, b8, b15].

In some embodiments the following operation is to then use the selected information bits to generate the CRC bit value. In some embodiments it is also possible to input all the control information bits into a conventional CRC generator to generate c1, c2, c3, c4 directly. In such embodiments when the information bits (for example b0 b4 b7 b8 b15) are to be output, the apparatus may be configured to combine the directly generated CRC bit (for example c4) with the control information bit to generate the combined bit sequence. In a similar manner the other CRC bits are appended (combined) when the information bits are selected based on the further selected generator matrix columns.

The operation of generating a CRC bit based on selected control information bits is shown in FIG. 5 by step 507.

Thus for the selected information bits in this example the CRC c4 (where the CRC is ci for the i'th column).

In some embodiments the generated CRC bit may then be appended or otherwise combined to the selected information bits to generate a combined bit sequence.

The operation of combining (appending) the selected control information bits and the CRC bit is shown in FIG. 5 by step 509.

In the above example this would result in an array of:

[b0, b4, b7, b8, b15, c4].

Furthermore in some embodiments the remaining columns (or an editable generator matrix) may be edited such that generator bits for any remaining selectable columns of the generator matrix where the current selected column has bit=1 are changed to a zero value. In some embodiments this operation may be performed contemporaneously with the earlier steps following the selection of the column.

The operation of editing the generator bits for any remaining columns of generator matrix where associated current selected generator column bit=1 is shown in FIG. 5 by step 509.

Thus for example the columns (2), (3), (4) shown above may be edited to:

| | | | | | | | | | | | | | | | | |
|---|---|---|---|---|---|---|---|---|---|---|---|---|---|---|---|---|
| [0 | 1 0 | 0 0 | 1 0 | 0 | 0* | 1 0 | 0 0 | 0 0 | 0] | (2a) |
| [0 | 0 1 | 0 0 | 0 1 | 0 | 0 | 1 1 | 0 0 | 0 0 | 0] | (3a) |
| [0 | 0 0 | 1 0 | 0 0 | 0* | 0 | 0 1 | 1 0 | 0 0 | 0] | (4a) |

Where * indicates a changed value.

In some embodiments the next column of the generator matrix may be selected according to the CRC transmission order. In other words until the last column to be processed is processed there is further performed a selecting of the next column of generator matrix based on determined CRC transmission order and the previous operations of the selecting the control information bits based on the (edited) further selected column values, the generating of the CRC bit based on the further generator bits, the combining of the bits and the further editing of the generator bits in the remaining columns.

The operation of selecting the next column of the generator matrix based on the determined CRC transmission order is shown in FIG. 5 by step 513 and the looping back to step 505 to perform a further series of the operations shown in step 507, 509 and 511 until the last 'selectable' column to be processed is processed.

Thus in the above example the next selected column (2a). As the column (2a) is processed from left to right to check the positions of the 1 bit values and selecting and transmit the information bits and the CRC bit. The new selected bits are:

[b1, b5, b9],

The CRC bit c3 is generated from a combination of these selected bits and b8. As discussed previously in some embodiments the CRC bit may be generated using a conventional CRC bit generator using the selected generator matrix column information.

Furthermore when combined these bits are appended to (combined with) the current combined bit sequence. In other words the new selected control information bits and CRC bit are transmitted following [b0, b4, b7, b8, b15, c4].

So the 'new' combined bits are:
[b0, b4, b7, b8, b15, c4, b1, b5, b9, c3]

At the same time the elements are marked to be zero where the remaining selectable column indices correspond to the current selected column indices of value 1. Thus columns (3a) and (4a) are edited to:

| | | | | | | | | | | | | | | | | |
|---|---|---|---|---|---|---|---|---|---|---|---|---|---|---|---|---|
| [0 | 0 1 | 0 0 | 0 1 | 0 0 | 0* | 1 | 0 0 | 0 0 | 0] | (3b) |
| [0 | 0 0 | 1 0 | 0 0 | 0 0 | 0 | 1 | 1 0 | 0 0 | 0] | (4b) |

Where * indicates a changed value.

Then the next selected column (3b) is processed and from left to right the values are checked to identify the position of the 1s and select the information bits and generate the CRC bit. Thus for example the 'new' selected information bits are:

[b2, b6, b10].

The CRC bit c2 is generated based on the selected information bits and b9, or using a conventional CRC bit generator using the selected (and unedited) generator matrix column information.

Furthermore when combined these bits are appended to (combined with) the current combined bit sequence. In other words the new selected control information bits and CRC bit are transmitted following [b0, b4, b7, b8, b15, c4, b1, b5, b9, c3]

The new combined bits are:
[b0, b4, b7, b8, b15, c4, b1, b5, b9, c3, b2, b6, b10, c2]

The elements are edited or marked to be zero where the remaining selectable column indices correspond to the current selected column indices of value 1. Thus column (4b) is edited to:

| | | | | | | | | | | | | | |
|---|---|---|---|---|---|---|---|---|---|---|---|---|---|
| [0 | 0 0 | 1 0 | 0 0 | 0 0 | 0 0* | 1 0 | 0 0 | 0] | (4c) |

Where * indicates a changed value.

The column (4c) is then selected and processed from left to right to check 1s and select the information bits. The 'new' selected information bits are:

[b3, b11].

The CRC bit c1 is generated based on the selected information bits, b7 and b10 or using a conventional CRC bit generator using the selected (and unedited) generator matrix column information.

Furthermore when combined these bits are appended to (combined with) the current combined bit sequence. In other words the new selected control information bits and CRC bit are transmitted following [b0, b4, b7, b8, b15, c4, b1, b5, b9, c3, b2, b6, b10, c2]

So the 'new' combined bits are:
[b0, b4, b7, b8, b15, c4, b1, b5, b9, c3, b2, b6, b10, c2, b3, b11, c1].

In some embodiments the following step is to determine if there are any remaining information bits/CRC bits and combine these to the combined bits. The total bit sequence may then be passed to the polar encoder and then output (to be stored and/or transmitted).

The operation of determining if there are any remaining information bits/CRC bits and combining these to the combined bits and polar encoding and outputting is shown in FIG. 5 by step 515.

Thus in the example above the information bits b12, b13, b14 are not related to CRC bits c1, c2, c3, c4. These remaining information bits are then appended to the combined bit sequence which becomes:

[b0, b4, b7, b8, b15, c4, b1, b5, b9, c3, b2, b6, b10, c2, b3, b11, c1, b12, b13, b14]

Furthermore in this example the remaining CRC bits c5 to c16 are generated and appended to the combined bit sequence to generate a final block transmission bit sequence:

[b0, b4, b7, b8, b15, c4, b1, b5, b9, c3, b2, b6, b10, c2, b3, b11, c1, b12, b13, b14, c5, c6, c7, c8, c9, c10, c11, c12, c13, c14, c15, c16]

Figure 6:
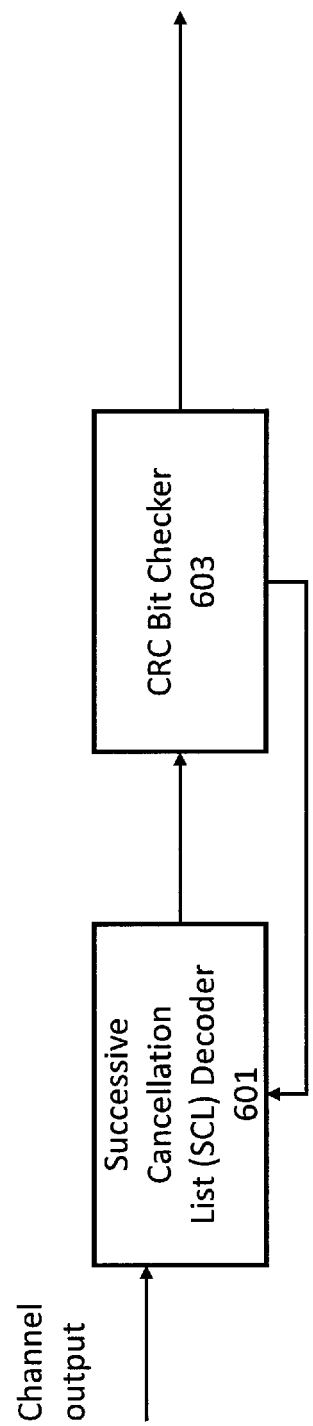
FIG. 6 illustrates an example decoder for use in the UEs and eNB of FIGS. 1 to 3 according to some embodiments.

With respect to FIG. 6 an example decoder is shown. The decoder comprises a successive cancellation list (SCL) decoder 601 which is configured to output bits based on decoding the channel output by applying an inverse to the polar encoding. However in some embodiments the decoder may be any suitable polar decoder variant which uses CRC or parity bits for tree pruning.

The decoder further comprises a CRC bit checker 603 which is configured to apply the CRC check to determine errors in the decoded data and control the successive cancellation decoder 601 based on the checks.

Figure 7:
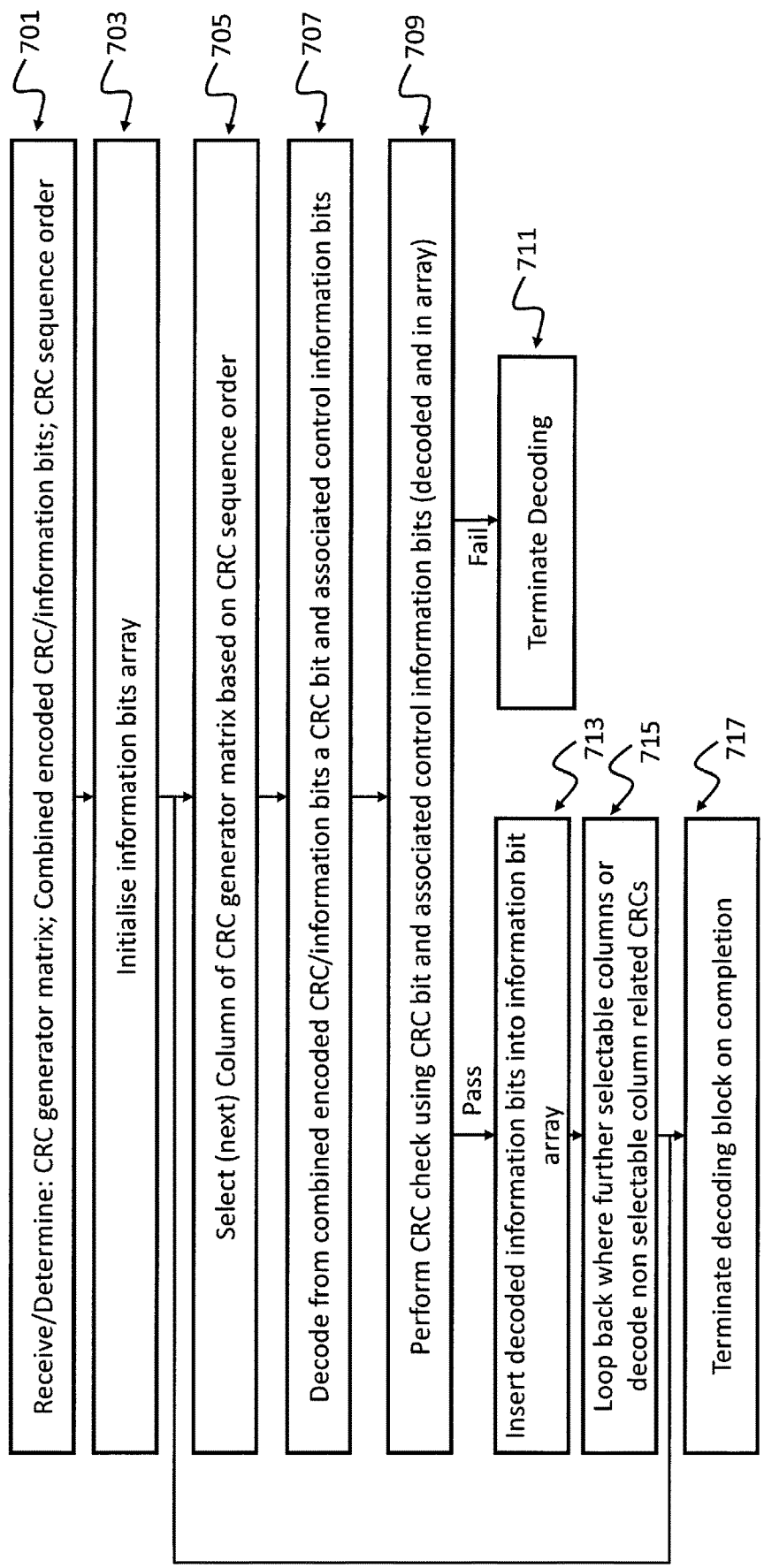
FIG. 7 is a flow diagram of the operation of the encoder as shown in FIG. 6 according to some embodiments.

FIG. 7 shows an example flow diagram showing the operation of the decoder as shown in FIG. 6.

The decoder (receiver) is configured to receive or generate the CRC generator matrix, the encoded combined CRC/information bits and the CRC sequence order.

The operation of receiving/determining the CRC generator matrix, the encoded combined CRC/information bits and the CRC sequence order is shown in FIG. 7 by step 701.

In some embodiments the decoder is configured to initialise an information bit array, where the decoded information bits may be stored.

The operation of initialising an information bit array is shown in FIG. 7 by step 703.

The decoder equivalent to the encoder example shown with respect to FIG. 5 may for example initialise the information bit array as:

[0 0 0 0 0 0 0 0 0 0 0 0 0 0 0 0].

In some embodiments the decoder is configured to select a (next) column of CRC generator matrix based on CRC sequence order.

The operation of selecting the next column of the CRC generator matrix is shown in FIG. 705.

The decoder example may thus extract the required length of the generator matrix sequence and generate a first selected (and in some embodiments also the other selectable columns) column array. Thus the first selected column (having removed the unused bits from the generator matrix.

| [1 | 0 | 0 | 0 | 1 | 0 | 0 | 1 | 1 | 0 | 0 0 0 0 0 1] | (10) |

The additional three selectable columns are:

| [0 | 1 | 0 | 0 | 0 | 1 | 0 | 0 | 1 | 1 | 0 0 0 0 0 0] | (20) |
| [0 | 0 | 1 | 0 | 0 | 0 | 1 | 0 | 0 | 1 | 1 0 0 0 0 0] | (30) |
| [0 | 0 | 0 | 1 | 0 | 0 | 0 | 1 | 0 | 0 | 1 1 0 0 0 0] | (40) |

In some embodiments the decoder is further configured to decode from combined encoded CRC/information bits a CRC bit and associated control information bits.

The operation of decoding from combined encoded CRC/information bits a CRC bit and associated control information bits is shown in FIG. 7 by step 707.

Thus for example the first set of bits decoded by the polar decoder is [b0, b4, b7, b8, b15, c4].

The decoder may then use the selected column, column (10) from left to right to check 1s and determine the corresponding information.

In some embodiments early termination and/or tree pruning can be performed accordingly. This could be done by the CRC detector using the decoded control information bits and CRC bit.

The operation of performing a CRC check using the selected column CRC bit and the decoded control information bits is shown in FIG. 7 by step 709.

In some embodiments the failing of the CRC may cause the decoding operation to be terminated.

The operation of terminating the decoding operation based on a failed CRC check is shown in FIG. 7 by step 711.

In some embodiments the corresponding information bits are inserted into the information bit array with the same indices. It is understood that in some embodiments this operation is performed prior to the CRC check and that the CRC check is configured to use only the control information in the information bit array (rather than a combination of the 'new' decoded control information bits and previously stored information bit array data). In other words place the corresponding information bits into the information bit array with the same indices. In some embodiments this may be achieved by loading the selected column values into a shift register and implementing a repeated (left) shift operation on the column array values and examining the most significant bit value before each shift. The decoded information bits are placed into the information bit array at the locations at the shift loop index value when the most significant bit has a 1 value.

Thus for example following the first selection the information bit array generated is:
[b0, 0, 0, 0, b4, 0, 0, b7, b8, 0, 0, 0, 0, 0, 0, b15].

At the same time the elements are marked to be zero where indices correspond to the indices of value 1 of the elements the column (10) in a similar manner to that shown in the encoder. Thus elements of the selectable columns are edited or marked to be zero where the remaining selectable column indices correspond to the current selected column indices of value 1. Thus columns (20), (30), and (40) are edited to:

| [0 | 1 0 | 0 0 | 1 0 | 0 | 0* | 1 0 | 0 0 | 0 0 | 0] | (20a) |
| [0 | 0 1 | 0 0 | 0 1 | 0 | 0 | 1 1 | 0 0 | 0 0 | 0] | (30a) |
| [0 | 0 0 | 1 0 | 0 0 | 0* | 0 | 0 1 | 1 0 | 0 0 | 0] | (40a) |

Where * indicates a changed value.

In some embodiments there may be looping back to step 705 where there are further selectable columns to be processed or where there are no further selectable columns then decode non selectable column related CRCs.

The operation of looping back to step 705 where there are further selectable columns to be processed or where there are no further selectable columns then decoding non selectable column related CRCs is shown in FIG. 7 by step 715.

Thus for example more bits are decoded [b1, b5, b9, c3] by the Polar decoder. The next column (20a) is selected and processed from left to right to check 1s and determine the corresponding information bits.

Early termination and/or tree pruning can be performed during Polar decoding. This could be done by the CRC detector.

Furthermore the corresponding information bits can be placed into the information bit array with the same indices.
[b0, b1, 0, 0, b4, b5, 0, b7, b8, b9, 0, 0, 0, 0, 0, b15]

Also elements of the remaining selectable columns are edited or marked to be zero where the remaining selectable column indices correspond to the current selected column indices of value 1. Thus columns (30a), and (40a) are edited to:

| [0 | 0 1 | 0 0 | 0 1 | 0 0 | 0* | 1 | 0 0 | 0 0 | 0] | (30b) |
| [0 | 0 0 | 1 0 | 0 0 | 0 0 | 0 | 1 | 1 0 | 0 0 | 0] | (40b) |

Where * indicates a changed value.

More bits may be decoded [b2, b6, b10, c2] by the Polar decoder. Using the next selected column, column (30b), and determining from left to right to check is the corresponding information bits are determined.

Early termination and/or tree pruning can further be performed by the CRC detector.

The placing of the corresponding information bits onto the information bit array with the same indices may then generate a new information bit array of:
[b0, b1, b2, 0, b4, b5, b6, b7, b8, b9, b10, 0, 0, 0, 0, b15]

Also elements of the remaining selectable columns are edited or marked to be zero where the remaining selectable column indices correspond to the current selected column indices of value 1. Thus column (40b) is edited to:

| [0 | 0 0 | 1 0 | 0 0 | 0 0 | 0 0* | 1 0 | 0 0 | 0] | (40c) |

More bits are decoded [b3, b11, c1] by Polar decoder.

Using the next selected column, column (40c), and determining from left to right to check 1s the corresponding information bits are determined.

These corresponding information bits can be placed into the information bit array with the same indices.

[b0, b1, b2, b3, b4, b5, b6, b7, b8, b9, b10, b11, 0, 0, 0, b15]

Then the additional information bits and CRC bits are decoded and they are inserted into the information bit array too to finally generate the full information bit sequence.

[b0, b1, b2, b3, b4, b5, b6, b7, b8, b9, b10, b11, b12, b13, b14, b15]

In some embodiments the decoder is configured to store the position of value 1s of the columns instead of the full 0/1 values.

In some embodiments all the columns of the selected CRC bits at the same time are generated and the CRC check is performed by matrix multiplying operation with the decoded information bits, other than the CRC detector.

The columns in the above method are based on the normal generator matrix structure, i.e. not the upper triangle form. In some embodiments it is also possible to use the upper triangle matrix form with additional processing. In such embodiments the generator matrix of $G_{K+1}$ contains $G_K$, but not the first or last row. The new row may be in the middle of the generator matrix. Then an additional sequence is needed to record the row number of the difference between $G_{K+1}$ and $G_K$. There needs K position values to be stored so that the generator matrix for smaller information block size can be obtained by an iterative manner. The benefit of such embodiments is it is relatively simpler and faster to perform a CRC check, but with further computation overhead.

In some embodiments it is possible to store the full generator matrix for a large information block and obtain the CRC generator matrix from it for a smaller information block size. In this method the columns are not generated with each other by shifting. They are just stored.

In some embodiments it is possible to use the full length sequence each time with one indicator to blind the unused part in the implementation.

In some embodiments the matrix generator configured to generate a suitable CRC code and interleave or distribute the CRC code within the information bits may be:

Select a $K_{max}$, which is the maximum value of all possible numbers of input information bits;

Generate the interleaving pattern for $K_{max}$, based on the process described herein;

When the number of information bits to be transmitted is K (where K is less than $K_{max}$), then follow the following operations to generate the sequence for encoding:

Generate the CRC bits for the K information bits;

Place all information and CRC bits in the buffer; For the remaining $K_{max}$-K bits, place <NULL> bits in the buffer;

Do interleaving for all the bits in the buffer, including the <NULL> bits;

After interleaving, remove the <NULL> bits at the output.

Figure 8:
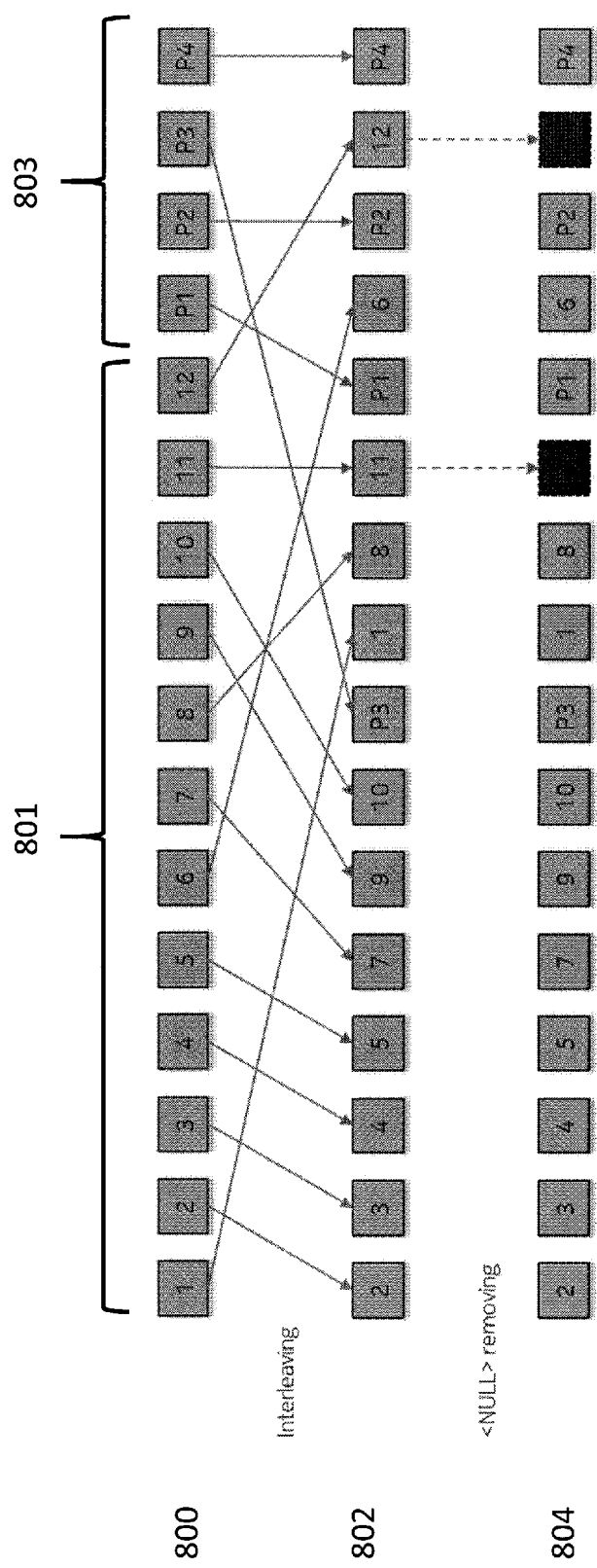
FIG. 8 shows an example interleaving according to some embodiments.

With respect to FIG. 8 an example interleaving is shown where $K_{max}$ 801=12, the number of CRC bits 803 is 4, and K=10. Thus for example the first row 800 shows the $K_{max}$ information bits 801 and the CRC bits P1, P2, P3, and P4 803.

In this case, the second row 802 shows a mother interleaving pattern for $K_{max}$=12, and it could be used for all K values less than or equal to $K_{max}$. In the example, K=10 is considered. Firstly P1, P2, P3, and P4 are generated and together with the 10 information bits, they are placed in the buffer in the bit positions indexed by 1, 2, . . . , 10, P1, P2, P3, and P4. In this example as shown in the third row 804 for information bits 11 and 12, <NULL> bits are inserted. Then interleaving is conducted. After the interleaving, two <NULL> bits are removed.

Encoding and decoding processes should take into consideration the mother interleaving pattern and the <NULL> removing process.

With this embodiment, only one interleaving pattern description is needed for all K values.

It should also be noted, that in some embodiments the decoder (receiver) may use this method and the encoder (transmitter) may still use the method proposed previously.

Appropriately adapted computer program code product may be used for implementing the embodiments, when loaded to a computer. The program code product for providing the operation may be stored on and provided by means of a carrier medium such as a carrier disc, card or tape. A possibility is to download the program code product via a data network. Implementation may be provided with appropriate software in a server.

Embodiments of the invention may be practiced in various components such as integrated circuit modules. The design of integrated circuits is by and large a highly automated process. Complex and powerful software tools are available for converting a logic level design into a semiconductor circuit design ready to be etched and formed on a semiconductor substrate.

Programs, such as those provided by Synopsys, Inc. of Mountain View, Calif. and Cadence Design, of San Jose, Calif. automatically route conductors and locate components on a semiconductor chip using well established rules of design as well as libraries of pre stored design modules. Once the design for a semiconductor circuit has been completed, the resultant design, in a standardized electronic format (e.g., Opus, GDSII, or the like) may be transmitted to a semiconductor fabrication facility or "fab" for fabrication.

In addition to the modifications explicitly mentioned above, it will be evident to a person skilled in the art that various other modifications of the described embodiment may be made within the scope of the invention.

What is claimed is:

1. A method comprising:
   determining a cyclic redundancy check generator sequence defining a one to one mapping between control information values that form a sequence of control information values and cyclic redundancy check values that form a sequence of cyclic redundancy check values;
   selecting a part of the cyclic redundancy check generator sequence; and
   determining a combined sequence, the combined sequence formed by distributing the sequence of cyclic redundancy check values within the sequence of control information values, wherein the distributing the sequence of cyclic redundancy check values within the sequence of control information values is based on the selected part of the cyclic redundancy check generator sequence.

2. The method as claimed in claim 1, wherein determining the cyclic redundancy check generator sequence defining a one to one mapping between the control information values and cyclic redundancy check values comprises determining a length of the cyclic redundancy check generator sequence based on a maximum control information block size to be encoded.

3. The method as claimed in claim 2, wherein determining the cyclic redundancy check generator sequence having the length determined based on the maximum control information block size to be encoded comprises generating an interleaving pattern based on the maximum control information block size to be encoded, wherein the interleaving pattern comprises blanking indices configured to enable the generation of the interleaving pattern for a smaller block size.

4. The method of claim 3, wherein the interleaving pattern comprises a single interleaving pattern.

5. The method as claimed in claim 2, wherein determining the cyclic redundancy check generator sequence having the length based on the maximum control information block size to be encoded comprises generating an interleaving pattern by selecting rows from a generator matrix in a bottom to top row order.

6. The method as claimed in claim 1, wherein determining the combined sequence comprises selecting the part of the cyclic redundancy check generator sequence based on a determined cyclic redundancy check transmission order.

7. The method as claimed in claim 6, wherein determining the combined sequence further comprises generating a combined sequence part by:
   selecting control information values from the sequence of control information values based on the position of values within the selected part of the cyclic redundancy check generator sequence;
   generating a first cyclic redundancy check value based on the selected control information values; and
   combining the selected control information values and the generated first cyclic redundancy check value to generate the combined sequence part.

8. The method as claimed in claim 7, further comprising amending elements of any further parts of the cyclic redundancy check generator sequence to a zero value where associated elements of the selected part of the cyclic redundancy check generator sequence have a value of one.

9. The method as claimed in claim 8, wherein determining the combined sequence further comprises generating further combined sequence parts by:
   selecting further parts of the cyclic redundancy check generator sequence based on a CRC transmission order sequence;
   selecting control information values from the sequence of control information values based on the position of values within the selected further parts of the cyclic redundancy check generator sequence;
   generating, for each of the further combined sequence parts, a cyclic redundancy check value based on the control information values identified in the further parts of the cyclic redundancy check generator sequence; and
   combining, for each of the further combined sequence parts, the selected control information values and the generated cyclic redundancy check value to generate the further combined sequence parts.

10. The method as claimed in claim 1, wherein determining the combined sequence comprises determining only part of the combined sequence based on the selected part of the cyclic redundancy check generator sequence.

11. The method as claimed in claim 1, wherein determining the cyclic redundancy check generator sequence comprises determining a cyclic redundancy check generator matrix, and wherein the selected part of the cyclic redundancy check generator sequence is a column of a cyclic redundancy check generator matrix selected based on a determined cyclic redundancy check transmission order.

12. The method as claimed in claim 1, wherein the control information values are control information bits and the cyclic redundancy check values are cyclic redundancy check sequence bits.

13. The method as claimed in claim 1, wherein the method is for enabling early termination of a polar encoded sequence of control information values, the method further comprising polar encoding the combined sequence, wherein the distributing of the sequence of cyclic redundancy check values within the sequence of control information values enables early termination of the polar encoded sequence.

14. A method comprising:
   decoding a combined sequence, the combined sequence comprising a determined sequence of cyclic redundancy check values within a sequence of control information values, the sequence of cyclic redundancy check values comprising cyclic redundancy check values and the sequence of control information values comprising control information values, to enable a cyclic redundancy check to be performed, the decoding generating a first cyclic redundancy check value and associated control information values based on a part of a received cyclic redundancy check generator sequence;
   performing the cyclic redundancy check based on the first cyclic redundancy check value and associated control information values;
   further decoding of the decoded combined sequence to enable further cyclic redundancy checks to be performed; and
   performing further cyclic redundancy checks based on the further decoding and based on a further part of the cyclic redundancy check generator sequence and at least one earlier decoded control information value.

15. The method as claimed in claim 14, wherein decoding the combined sequence comprises editing the sequence of control information values based on the at least one earlier decoded control information value and the part of a received cyclic redundancy check generator sequence.

16. The method as claimed in claim 15, wherein further decoding the combined sequence to enable further cyclic redundancy checks to be performed comprises editing the sequence of control information values based on the further decoded control information values and the further parts of the received cyclic redundancy check generator sequence.

17. The method as claimed in claim 14, wherein generating a first cyclic redundancy check value and associated control information values based on a part of a received cyclic redundancy check generator sequence comprising identifying a control information value location within the sequence of control information values based on the position of values within the received part of the cyclic redundancy check generator sequence.

18. The method as claimed in claim 14, for decoding the combined sequence having values comprising the determined cyclic redundancy check value sequence within the sequence of control information values such that the order of the values enables an early termination of decoding based on the cyclic redundancy check, the method further comprising terminating decoding when failing the cyclic redundancy check or at least one of the further cyclic redundancy checks.

19. The method as claimed in claim 14, further comprising receiving or determining a cyclic redundancy check generator sequence defining a one to one mapping between the control information values and the cyclic redundancy check values, the cyclic redundancy check generator sequence comprising a cyclic redundancy check generator sequence of length based on a maximum control information block size to be encoded.

20. The method as claimed in claim 19, wherein receiving or determining a cyclic redundancy check generator sequence comprises receiving or determining an interleaving pattern based on the maximum control information block size to be encoded, wherein the interleaving pattern comprises blanking indices configured to enable the determination of a distribution pattern for a smaller block size.

21. An apparatus comprising:
a cyclic redundancy check sequence generator configured to determine a cyclic redundancy check generator sequence defining a one to one mapping between control information values that form a sequence of control information values and cyclic redundancy check values that form a sequence of cyclic redundancy check values;
a cyclic redundancy check generator sequence part selector configured to select a part of the cyclic redundancy check generator sequence; and
a sequence determiner configured to determine a combined sequence, the combined sequence formed by distributing the sequence of cyclic redundancy check values within the sequence of control information values, wherein the distributing the sequence of cyclic redundancy check values within the sequence of control information values is based on a selected part of the cyclic redundancy check generator sequence selected with the cyclic redundancy check generator sequence part selector.

22. An apparatus comprising:
a cyclic redundancy check sequence generator configured to determine a cyclic redundancy check generator sequence defining a one to one mapping between at least one control information value that forms a control information value sequence and at least one cyclic redundancy check value that forms a cyclic redundancy check value sequence;
a cyclic redundancy check generator sequence part selector configured to select a part of the cyclic redundancy check generator sequence; and
a sequence determiner configured to determine a combined sequence, the combined sequence formed by distributing the cyclic redundancy check value sequence within the control information value sequence, wherein the distributing of the cyclic redundancy check value sequence within the control information value sequence is based on a selected part of the cyclic redundancy check generator sequence selected with the cyclic redundancy check generator sequence part selector.

* * * * *